(12) United States Patent
Zhang

(10) Patent No.: US 6,341,998 B1
(45) Date of Patent: Jan. 29, 2002

(54) INTEGRATED CIRCUIT (IC) PLATING DEPOSITION SYSTEM AND METHOD

(75) Inventor: Liming Zhang, Sunnyvale, CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/434,636

(22) Filed: Nov. 4, 1999

(51) Int. Cl.$^7$ ................................................. B24B 1/00
(52) U.S. Cl. ............................ 451/41; 451/36; 451/57; 451/60; 451/65; 451/288; 451/290
(58) Field of Search ........................... 451/36, 57, 60, 451/65, 287, 288, 290

(56) References Cited

U.S. PATENT DOCUMENTS

| | | | |
|---|---|---|---|
| 3,436,259 A | 4/1969 | Regh et al. | |
| 5,246,525 A | 9/1993 | Sato | |
| 6,004,880 A | 12/1999 | Liu et al. | |
| 6,071,808 A | * 6/2000 | Merchant et al. | 438/633 |
| 6,107,186 A | * 8/2000 | Erb | 438/633 |
| 6,110,011 A | * 8/2000 | Somekh et al. | 451/28 |

FOREIGN PATENT DOCUMENTS

| | | |
|---|---|---|
| DE | 2008664 A | 9/1971 |
| FR | 1 139882 A | 7/1957 |
| WO | WO 26443 | 5/2000 |
| WO | WO 59682 | 10/2000 |

* cited by examiner

*Primary Examiner*—Joseph J. Hail, III
*Assistant Examiner*—Shantese McDonald
(74) *Attorney, Agent, or Firm*—Wagner, Murabito & Hao LLP

(57) ABSTRACT

The present invention system and method facilitates efficient material deposition and wafer planarization during IC wafer fabrication. The present invention is particularly useful in facilitating efficient copper deposition and manufacturing of interconnections between components of an IC. A deposition polishing system and method of the present invention performs copper deposition and polishing concurrently. One embodiment of a deposition polishing system comprises a wafer holder, polishing pad component, and CMP plating bath. The CMP plating bath is a container for holding solutions utilized in plating processes (e.g., electroplating, electroless plating, etc.) to deposit metallic material (e.g., copper) on a wafer. A wafer is placed in the plating bath containing plating solution and while metallic material is being deposited on the wafer the polishing pad component impedes deposition of material on portions of the wafer surface while facilitating deposition in other desired locations of the wafer surface (e.g., an interconnection trench). The polishing pad component also facilitates transportation of the plating solution to the wafer and the motion of the polishing pad component agitates the plating solution.

20 Claims, 5 Drawing Sheets

INTEGRATED CIRCUIT (IC) PLATING DEPOSITION SYSTEM AND METHOD

FIELD OF THE INVENTION

The present invention relates to the field of integrated circuit (IC) manufacturing. More particularly the present invention relates to system and method of copper plating deposition on an IC wafer.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems include processors that have facilitated increased productivity and reduced costs in analyzing and communicating data, ideas and trends in most areas of business, science, education and entertainment. Frequently, electronic systems designed to provide these results include integrated circuits (ICs) on chip wafers with metal components (e.g., copper interconnections between components of the IC). Often these metal components are critical to the functionality of an IC and it is important for them to be manufactured in an efficient and effective manner. Traditional methods of depositing metal in a wafer often include multistep processes that expend significant time performing sequential steps and require extensive resources to be expended focusing attention on relatively delicate operations that are subject to significant defect rates.

The starting material for typical ICs is very high purity silicon. The pure silicon material is grown as a single crystal that takes the shape of a solid cylinder. This crystal is then sawed (like a loaf of bread) to produce wafers typically 10 to 30 cm in diameter and 250 microns thick. Electronic components are then constructed on the wafer by adding multiple layers to the wafer through a process of lithography (e.g., photolithography, X-ray lithography, etc.). Lithographic processes form electronic components in a wafer layer by developing regions with defined electrical characteristics. Complex ICs can often have many different built up layers, with each layer being stacked on top of the previous layer and comprising multiple components with a variety of interconnections.

Most typical photolithographic integrated circuit chip fabrication processes include a deposition phase in which material of differing electrical characteristics is deposited in a space created in a diffusion material. Deposition phases of a lithographic process are often utilized to create components (e.g., resistors, diodes, transistors, etc.) and electrical interconnections between the components. Current technology electrical interconnections often include lines and plugs that are deposited in dielectric layers of the wafer. In the past, lines typically comprised aluminum (or an aluminum alloy) and plugs included tungsten. However, as component sizes become smaller and more layers of metalization are fabricated, interconnections comprising copper are becoming more prevalent. Copper interconnections typically provide several advantages over other materials including lower electrical resistivity and better electromigration resistance.

Usually, a copper damascene process is utilized to deposit copper on a wafer since copper etching is essentially not a viable option. In most damascene processes a deposition material is applied to a substantial portion of wafer surface to be sure that the desired spaces or locations are filled. However, applying the deposition material to most of the wafer surface results in the deposition material effectively creating an unwanted layer that has to be removed in a subsequent step (e.g., removed by a chemical mechanical polishing step). For example, in order to ensure complete filling of a trench, usually excess copper is deposited on most of a wafer surface. However, the excess copper usually interferes with the performance and electrical characteristics of the IC. Excess copper often creates a conductive path past subsequent dielectric material layers designed to provide electrical insulation.

A cross section of a typical conductive line (e.g., copper metalization) produced in the lithographic manufacturing of very large scale integrated (VLSI) device 100 is shown in FIG. 1. After a trench is formed by an lithographic etching process, a thin layer of barrier material 120 (e.g., Ta, TaN, etc.) is deposited to prevent the inter-diffusion between copper and the silicon substrate 130. Then a bulk layer of copper 110 is applied to a substantial area of a wafer surface. The copper deposited between the elevation 150 and elevation 170 is excess copper. Typically, the excess copper is removed in a chemical mechanical process (CMP) to prevent unintentional formation an inappropriate conductive path between devices included in the IC. For example, not removing the excess copper usually results in a layer of conductive material that conducts electricity to inappropriate areas of the integrated circuit (e.g., a short circuit between transistors). After the excess copper and the barrier layer are removed a dielectric layer is applied on top of the wafer surface. Thus, electrically conductive copper paths are confined to trenches forming lines and plugs purposely created between devices.

Removing excess copper also is important to achieving a planarized wafer surface. A level or planarized wafer surface assists lithographic processes to achieve accurate reproduction of very fine surface geometries accurately and integration of more components (resistors, diodes, transistors, and the like) on underlying chip or IC. The primary manner of incorporating more components in a chip is to make each component smaller. Typically, smaller electronic components are built on a chip by increasing optical resolution of a photolithographic process. However, this results in narrowing the depth of focus which is limited by ranges at which a lens remains effective. Depth of focus problems are exacerbated by bumpy topographies on the wafer that usually result during the lithography process of adding layers of material with varying geometric sizes. Thus, in order to focus desirable mask images defining sub-micron geometries onto each of the intermediate photosensitive layers in a manner that achieves the greatest number of components on a single wafer, a precisely flat surface is desired.

Chemical-mechanical polishing (CMP) is the most prevalent method of removing excess conductive copper and obtaining full planarization of a wafer layer. CMP processes usually involve removing excess conductive material by using an abrasive and chemical contact between the wafer and a moving polishing pad covered with a polishing slurry. While typical chemical mechanical polishing processes remove excess copper, they also usually entail detrimental side affects. Copper CMP processes are relatively delicate and require a significant amount of attention. For example, CMP of copper is usually more difficult than tungsten and oxide. Copper is usually prone to both chemical and mechanical attacks. More specifically, copper film typically deposited on a wafer is easily scratched during CMP. As abrasive slurry is consumed during the polishing process the abrasive particles usually scratch the copper.

Utilizing CMP to remove excess copper typically includes time consuming and corrosive multistep operations. Polishing copper by CMP often requires expensive multiple slurries and polishing steps, primarily because the removal rate of copper and barrier layers are significantly different. Most CMP processes are wet processes that require significant time to dry after each CMP step and utilizing "wet" fluids significantly adds to the probability of corrosion problems. In addition to difficulties in CMP itself, post-CMP cleaning to remove defects and contaminants from the copper film and surrounding dielectric film is also challenging. Most post CMP cleaning processes include water that is very corrosive to copper lines or plugs. Cleaning chemicals and cleaning tools have to be well designed so that the film is not damaged (e.g., roughened) while it is being cleaned. Post CMP cleaning to remove copper waste from the wafer surface is very critical to device performance since any unremoved waste copper particles have a high probability of diffusing into dielectric materials (e.g., SiO) and interfering with insulation properties. Since copper diffuses into silicon relatively fast, fewer copper CMP steps reduces the exposure of a wafer to potential copper contamination.

What is required is a system and method that facilitates efficient manufacturing of copper interconnections between components of an IC. The system and method should permit copper lines and plugs that are coupled to IC components to be manufactured in a wafer in a manner that maximizes the overall manufacturing wafer output capacity. The system and method should also facilitate efficient removal of excess deposition material and planarization of a wafer layer.

SUMMARY OF THE INVENTION

The present invention is a system and method that facilitates efficient material deposition and wafer planarization during IC wafer fabrication. The present invention is particularly useful in facilitating efficient copper deposition and manufacturing of interconnections between components of in IC. A plating deposition polishing system and method of the present invention facilitates deposition of copper interconnection lines and plugs by performing copper deposition and polishing concurrently. The present invention deposition polishing system and method permits copper lines and plugs that are coupled to IC components to be manufactured in a wafer in a manner that maximizes the overall manufacturing wafer output capacity by eliminating sequential delays between copper deposition and wafer planarization. The system and method of the present invention also facilitates efficient planarization of a wafer layer and removal of excess deposition material. In addition, the present invention reduces resources spent on relatively delicate operations and reduces defect rates.

In one embodiment of the present invention, a deposition polishing system comprises a wafer holder, polishing pad component and a CMP plating bath. The CMP plating bath is a container for holding solutions utilized in plating processes (e.g., electroplating, electroless plating, etc.) to deposit metallic material (e.g., copper) on a wafer. A wafer is placed in the plating bath containing plating solution and the polishing pad component impedes the deposition of copper on portions of the wafer surface by applying a frictional force to the surface of the wafer. Copper is deposited in desired locations (e.g., interconnections trenches between components) of a wafer while other areas of the wafer surface are polished. The planarization is controlled to impede copper deposition and remove excess material from portions of a wafer surface while leaving the cooper deposited in other locations (e.g., an interconnection trench). For example, in an electroplating embodiment of present invention, a differential electrical potential is adjusted to ease material removal from the wafer surface. The polishing pad component also facilitates transportation of the plating solution to the wafer and the motion of the polishing pad component agitates the plating solution, enhancing the redistribution of ions in the plating solution to desired deposition locations of a wafer (e.g., an interconnection trench).

DETAILED DESCRIPTION OF THE INVENTION

Reference will now be made in detail to the preferred embodiments of the invention, a plating deposition polishing system and method, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail to avoid unnecessarily obscuring aspects of the current invention.

The system and method of the present invention performs deposition and polishing operations at the same time. In one embodiment of the present invention a metallic material (e.g., copper) is deposited in desired locations of a wafer by placing the wafer in a plating solution while polishing is utilized to impede deposition and remove material from other (undesired) locations. A deposition polishing system and method of the present invention deposits materials in desired locations of a wafer and polishes the wafer in less time than traditional processes in which copper deposition and CMP occur sequentially. The high throughput and equipment footprints of the present invention significantly reduces the cost of copper metalization and excess material removal.

Figure 1:
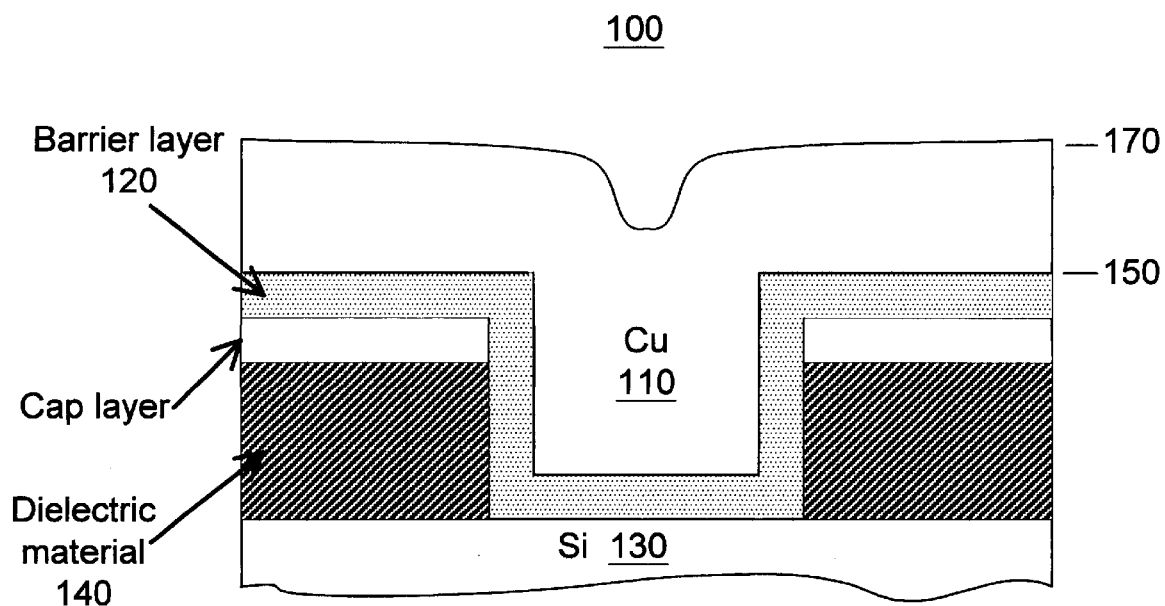
FIG. 1 shows a typical structure of metalization (e.g., copper metalization) produced in the lithographic manufacturing of very large scale integrated (VLSI) device.
Figure 2A:
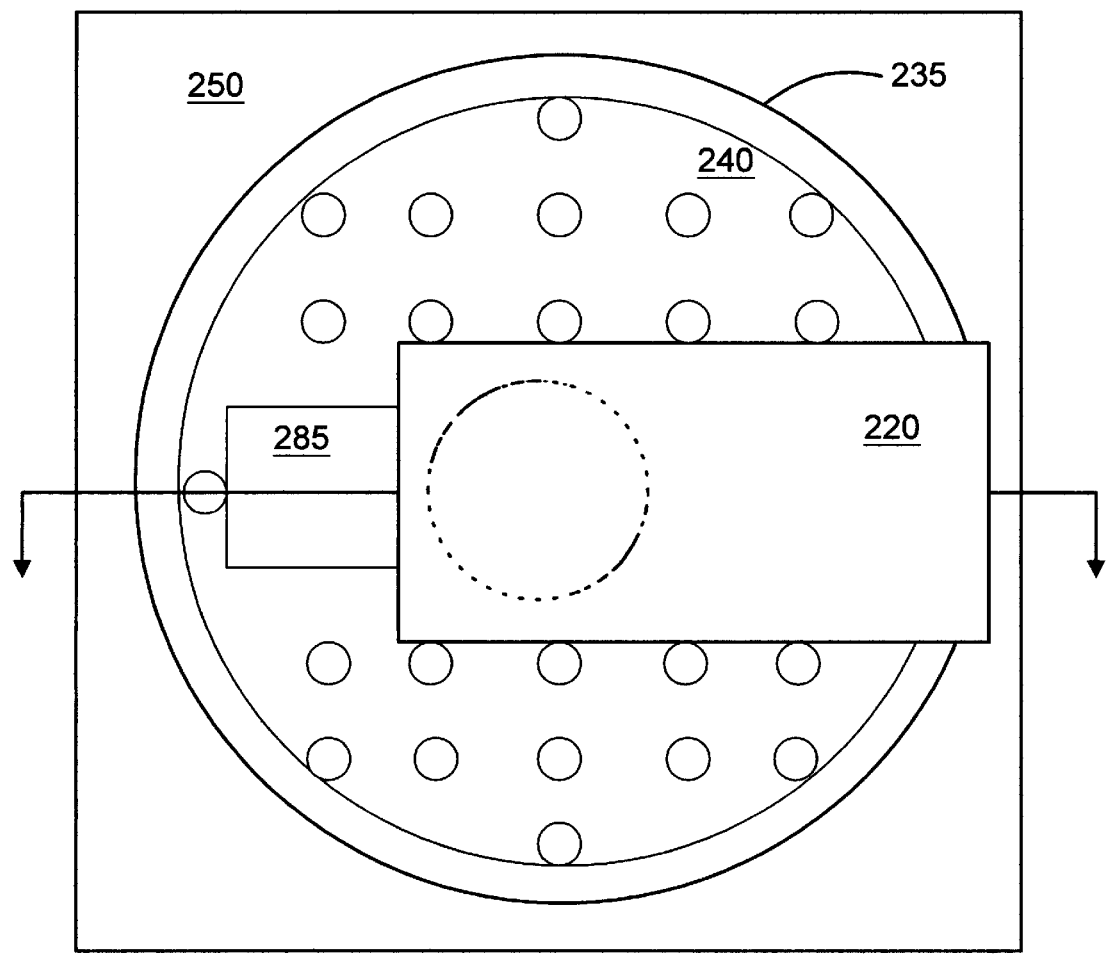
FIG. 2A is a down view of one embodiment of a deposition polishing system of the present invention.
Figure 2B:
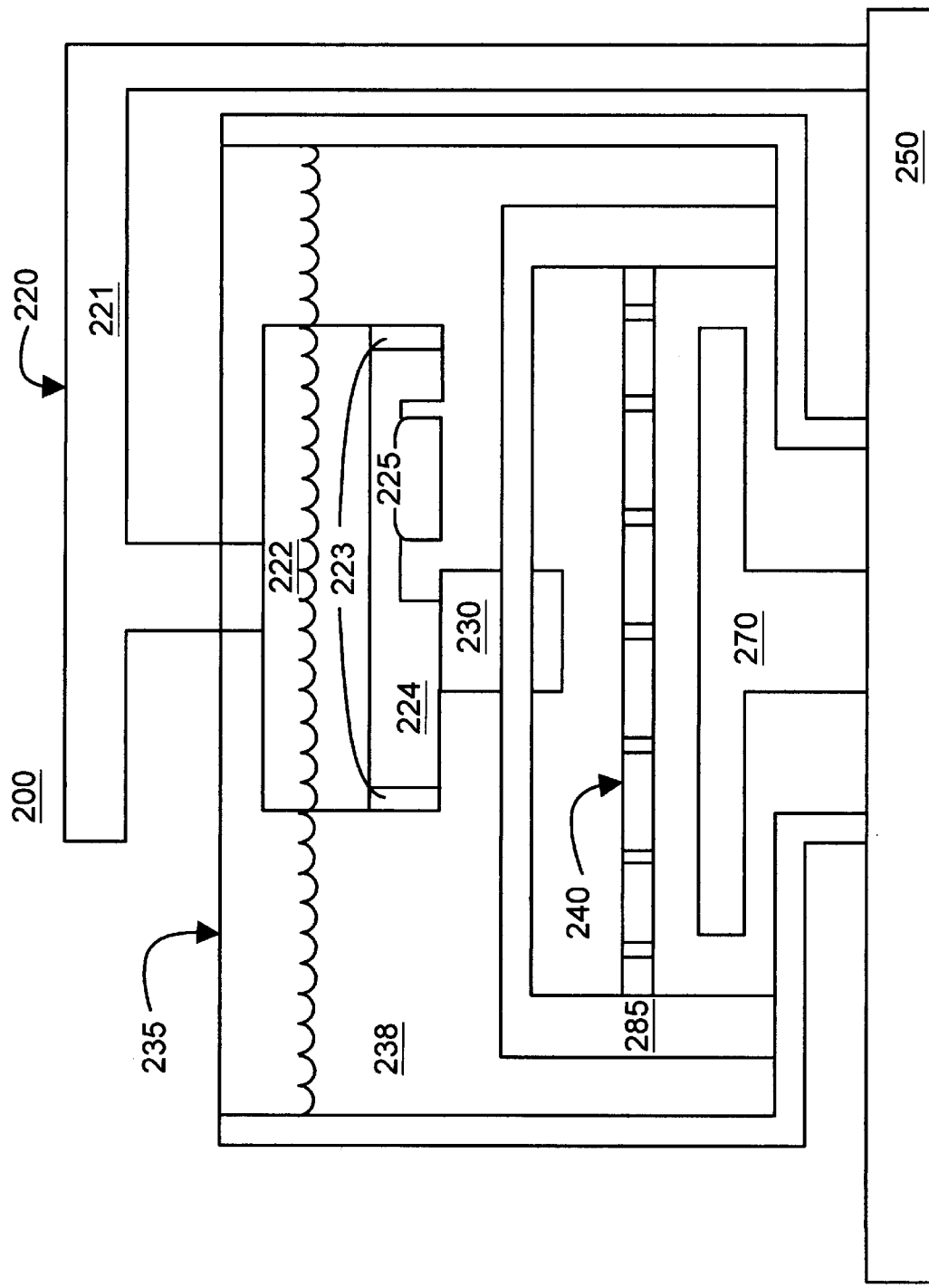
FIG. 2B is a side view of one embodiment of a deposition polishing system of the present invention.

FIG. 2A is a down view and FIG. 2B is a side view of a deposition polishing system 200, one embodiment of the present invention. Deposition polishing system 200 comprises a wafer holder 220, polishing pad component 230, plating bath 235, filter 240, anode 270, support rail 285 and polishing deposition machine 250. Polishing deposition machine 250 is coupled to a wafer holder 220, plating bath 235 and anode 270. Plating bath 235 is coupled to support rail 285 which is coupled to polishing pad component 230 and filter 240.

The components of deposition polishing system 200 cooperatively operate to impede copper deposition on some areas of a wafer surface while permitting copper to be deposited in other areas of the wafer. Wafer holder 220 holds an IC wafer (e.g., wafer 224) in place (e.g., against polishing pad component 230). In one exemplary implementation of the present invention, a wafer (e.g., wafer 224) comprises interconnection trenches (e.g., trenches 225) formed during a lithographic process. Polishing pad component 230 impedes copper deposition on portions of the wafer surface and polishes the IC wafer by applying a physical force to the surface of the wafer. Plating bath 235 is adapted to hold plating solutions (e.g., plating solution 238) comprising metal (e.g., copper) compounds and other plating additives. Filter 240 facilitates an even redistribution of plating solutions. Polishing deposition machine 250 provides an interface to control deposition polishing system 200. The components of deposition polishing system 200 comprise a variety of embodiments.

Polishing pad component 230 is utilized to impede the deposition of copper in some locations of a wafer's surface and remove undesirable material from the surface of a wafer. Polishing pad component 230 is adapted to obstruct copper particles from depositing on portions of a wafer surface and to apply a frictional force to those wafer surface areas while the wafer (e.g., wafer 224) is in plating bath 235. Polishing pad component 230 moves back and forth across supporting rail 285 at a predetermined speed. In one embodiment of the present invention, abrasive polishing pad 230 is made of a material that aids the polishing process without the use of abrasive particles suspended in a slurry. In one embodiment of the present invention, polishing pad component 230 is adapted to facilitate transportation of metallic (e.g., copper) molecules in a plating solution to deposition areas (e.g. an interconnection trench) on a wafer (e.g., wafer 224).

Plating bath 235 is a container for holding solutions utilized in plating processes to deposit metallic material (e.g., copper) on a wafer (e.g., wafer 224). Plating bath 235 is adapted to contain a plating solution. In one embodiment of the present invention, the plating solution comprises metallic ion compounds that are attracted to and deposited on the wafer surface. For example, copper molecules are deposited on desired locations of the wafer in accordance with a chemical reaction (e.g., $Cu^{2+}+2e^-\rightarrow Cu$). In one embodiment of the present invention the plating solutions comprise metal components and other plating components (e.g., a catalyst, a brightener, etc.)

Wafer holder 220 picks up a wafer (e.g., wafer 224) and holds it in place. Wafer holder 220 comprises a holder arm 221, a carrier 222 and a carrier ring 223. Holder arm 221 is coupled to CMP machine 250 and carrier 222 which is coupled to carrier ring 223. The lower surface of the wafer 224 rests against polishing pad component 230. The upper surface of the wafer 224 is held against the lower surface of the carrier 222. As polishing pad component 230 slides across the surface of wafer 224, carrier 222 also rotates wafer 224 at a predetermined rate while forcing the wafer onto polishing pad component 230 with a predetermined amount of down force. The rubbing resulting from the frictional force caused by the rotating action of both polishing pad 230 and wafer 224 combine to impede deposition of copper on portions of the wafer surface and polish the wafer 224.

Polishing deposition machine 250 operates as the primary interface and motor mechanism of deposition polishing system 200. In one embodiment of the present invention polishing deposition machine 250 includes a motor that drives polishing pad component 230 on supporting rail 285 and rotates wafer carrier 222. In one example of deposition polishing system 200, polishing deposition machine 250 includes a computer system that controls deposition and polishing operations, such as the flow rate of a plating solution, the downward force and rotational rate of wafer carrier 222, the movement of polishing pad component 230, etc.

Deposition polishing system 200 facilitates efficient metallic material deposition plating and polishing processes. Metal molecules in a plating solution are deposited in desired locations of a wafer while the wafer is polished to remove excess metal molecules and other material from other areas of the wafer surface. In one embodiment of the present invention, copper is deposited in interconnection trenches between components of a wafer while areas of the wafer surface are polished. A wafer (e.g., wafer 224) is placed on polishing pad component 230 inside of plating bath 235 containing a solution of copper ions. While copper metal is deposited during the plating process, polishing pad component 230 while pressed against the rotating wafer. The polishing action of polishing pad component 230 prevents significant amounts of copper from forming on the surface area of the wafer other than the inside of a trench. Thus, the polishing pad component 230 does not have a significant adverse affect on the deposition of copper into the trench. In one embodiment of the present invention, grooves and ducts in polishing pad component 230 aid copper deposition by facilitating transportation of copper ions to the volume inside the trench.

Figure 2C:
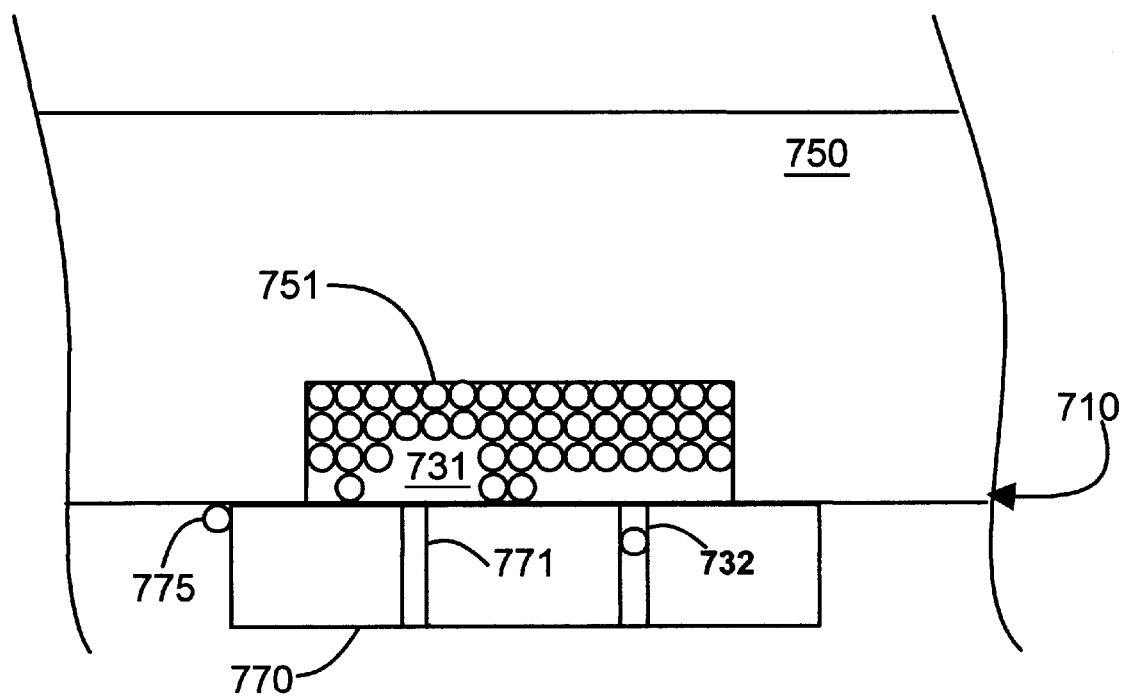
FIG. 2C shows one example of a polishing pad of the present invention removing excess metallic material and uneven wafer surface material from a wafer while metallic material is deposited on the wafer.

FIG. 2C shows one example of a polishing pad of the present invention removing excess metallic material and uneven wafer surface material from a wafer while metallic material is deposited on the wafer. Metallic molecules 731 (e.g., copper) are deposited in interconnection trench 751 of wafer 750. Grooves and ducts (e.g., duct 771) of polishing pad 770 facilitate transportation of metallic ions (e.g., copper ion 732) to a desired deposition location (e.g., interconnection trench 751). Polishing pad 770 also planarizes wafer 750 by impeding the deposition of copper (e.g., molecule 775) outside of interconnection trench 751 and removing material below plane 710 while metallic material is being deposited in the desired location (e.g., interconnection trench 751). Polishing pad 770 impedes the deposition of copper in areas other than trenches by removing most of the cooper ions before a significant number of them have an opportunity to bond to undesired areas of the wafer surface.

In one embodiment of the present invention, deposition polishing system 200 utilizes electroplating processes to deposit metal on a wafer (e.g., copper in interconnection trenches of a wafer). In one example of an electroplating process of the present invention, the components of deposition polishing system 200 contribute to the formation of an electrolytic cell. Plating bath 235 is filled with a electrolytic solution comprising copper ions. The interconnection trenches of a wafer serve as a cathode during the electroplating process and a differential electrical potential is applied to the wafer. The differential electrical potential applied to the wafer results in a negative electron concentration ($e^-$) in the interconnection trenches of the wafer that attract and combine with the positive copper ions ($Cu^{2+}$) to form copper metal (Cu) in the interconnect trenches of the wafer. In one embodiment of the present invention, a piece of copper metal (e.g., a copper pipe) function as an anode. An oxidation reaction (in which copper ions are released) takes place on the anode.

In another embodiment of the present invention, deposition polishing system 200 utilizes an electroless plating process. Electroless plating uses a redox reaction to deposit metallic material on the wafer (e.g., in the interconnection trenches of a wafer). Electroless plating permits a constant copper ion concentration to bathe the interconnection trenches of a wafer depositing copper evenly in the trenches. Electroless plating includes reduction of a complexed copper with formaldehyde in an alkaline solution (e.g., sodium hydroxide, copper sulfate, etc.). In a complex reaction catalyzed by palladium, the alkaline solution is broken down and the formaldehyde is oxidized, reducing the copper ion to metallic copper that is deposited in the interconnection trenches in the wafer. In one embodiment of the present invention, electroless plating is utilized to deposit a copper seed layer on the wafer surface and that serves as the conducting film for electroplating of additional copper into interconnection trenches of the wafer.

Deposition polishing system 200 facilitates the reduction of contamination and corrosion problems. By significantly impeding or preventing the deposition of copper in areas other than desired locations, there is less chance of copper particles diffusing with and contaminating other wafer materials (e.g., SiO). In addition there is little or no CMP processing of a wafer required to remove excess copper. Reducing CMP process and/or eliminating CMP steps after deposition saves significant resources (e.g., processing time, expensive CMP materials and slurries, etc.). Furthermore the number of wet post polishing cleaning steps is reduced and therefore there is less chance of corrosion occurring.

There are several other additional advantages that are realized by utilizing deposition polishing system 200. In one embodiment of the present invention, the motion of polishing pad component 230 agitates the plating solution and enhances the redistribution of copper ions in the plating solution to desired deposition areas of a wafer (e.g., an interconnection trench). In addition, the pressure and the motion of polishing pad component 230 is controlled to remove a copper seed layer and barrier layer from desired wafer surface areas at the end point of the plating process, while leaving the copper deposited in other locations (e.g., an interconnection trench). Furthermore, since slurry is not utilized in some embodiments of deposition polishing system 200 there are no detrimental side affects associated with abrasive slurries. For example, there is no uneven polishing due to agglomeration of slurry particles and spent slurry particles do not clog pits, grooves, ducts, holes, etc. in a polishing pad.

Deposition polishing system 200 is particularly advantageous in electroplating operations. In one embodiment of deposition polishing system 200, electrical potential applied to a cathode (e.g., wafer 224) or anode is varied to assist material removal from the desired wafer surface area (e.g., around an interconnection trench). Deposition CMP system 200 is also particularly advantageous in monitoring both electroplating and polishing. The electrolytic circuit formed by the cathode, anode and ionized solution in plating bath 235 is capable of supervising both copper deposition and the material removal by observing and controlling the current or the electrical potential in the electrolytic circuit.

In other embodiments of the present invention, polishing pad component 230 has a variety of configurations. One embodiment of Polishing pad component 230 is a plating solution dispensing polishing pad comprises groves and ducts that facilitate transportation of copper ions to desired areas of a wafer (e.g., an interconnection trench) and waste particles away from the wafer surface. In one embodiment of the present invention, polishing pad body 230 has a diameter and a lower surface substantially parallel to the plane defined by the diameter and an outer radius surface substantially orthogonal to the plane defined by the diameter. An upper surface is located opposite the lower surface. The polishing pad component is adapted to impede the deposition of copper and remove a portion of excess wafer material when rubbed against the surface of the wafer. Solution dispensing ducts extend through the solution dispensing polishing pad from the lower surface to the upper surface, wherein the solution dispensing duct is adapted to permit a plating solution to flow from a lower surface to an upper surface of the solution dispensing polishing pad to the wafer.

The plating solution dispensed though the ducts of the solution dispensing polishing pad assist in depositing metallic material (e.g., copper) in desired locations of a wafer (e.g., interconnection trenches) and offer other significant advantages. The solution flow in the present invention is adjusted to minimize the scratching of the wafer surface by the polishing pad component. Dispensing the solution through the pad directly onto the surface of the wafer permits the metallic material to fill desired locations in the wafer very effectively. Furthermore, solutions dispensed though the ducts of the solution dispensing polishing pad aid in the removal of particulate contaminants.

Figure 3:
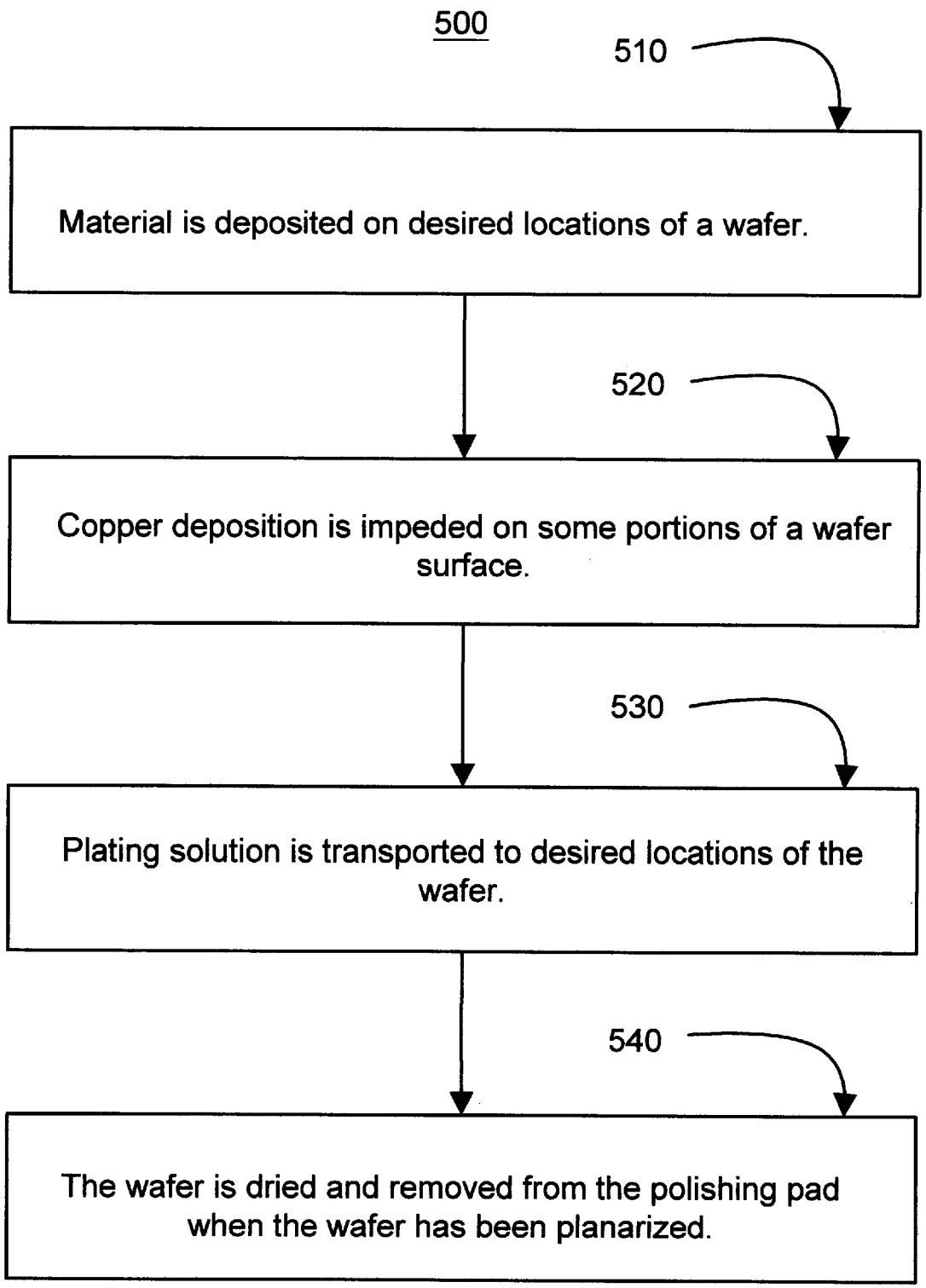
FIG. 3 is a flow chart of one embodiment of the present invention deposition polishing method.

FIG. 3 is a flow chart of deposition polishing method 500. Deposition polishing method 500 deposits materials on a wafer and polishes the wafer concurrently. In one embodiment of deposition polishing method 500, a metallic material (e.g., copper) is deposited in desired locations of a wafer by placing the wafer in a plating solution while polishing is utilized to impede copper deposition and remove material from undesired locations of a wafer surface. Deposition polishing method 500 is particularly useful in facilitating efficient copper deposition and manufacturing of interconnections (e.g., pugs and lines) between components of an IC.

In Step 510 material is deposited on desired locations of a wafer. In one embodiment of deposition method 500, a plating process is used to deposit material on a wafer. For example, a wafer holder (e.g., wafer holder 220) picks up a wafer and places it in a plating bath containing a plating solution. In one example of deposition polishing method 500, interconnection material (e.g., copper metal) is suspended in a plating solution. In one embodiment of the present invention, the plating solution is agitated which enhances the redistribution of ions in the plating solution to desired deposition areas of a wafer (e.g., an interconnection trench). In one embodiment of the present invention, deposition polishing method 500 utilizes an electroplating process to deposit material on a wafer (e.g., copper in interconnection trenches of a wafer). In another embodiment of the present invention, deposition polishing system 500 utilizes an electroless plating process.

In one example of an electroplating process of the present invention, the deposition polishing method 500 includes the formation of an electrolytic cell comprising a plating bath containing electrolytic solution. A differential electrical potential is applied to the wafer. In one implementation of deposition polishing method 500, the wafer surface with interconnection structures serve as a cathode during the electroplating process. The differential electrical potential applied to the wafer results in a negative electron concentration ($e^-$) that attracts and combines with the positive ions (e.g., $Cu^{2+}$ forming copper metal (Cu) in the interconnect trenches of the wafer). In one embodiment of the present invention, the electroplating process is resupplied with deposition material from an anode (e.g., a piece of copper metal).

In one embodiment of deposition polishing method 500, the differential electrical potential applied to a cathode (e.g., wafer 224) or anode assists in material removal from portion of a wafer surface area (e.g., around an interconnection trench). In one example of the present invention the differential electrical potential is varied. In one embodiment of deposition polishing system 500, the differential electrical potential monitors both electroplating and copper polishing electrochemical reactions. In another embodiment of deposition polishing system 500, the electrolytic circuit formed by the cathode, anode and ionized solution facilitates supervision of copper deposition and planarization (e.g., by observing and controlling the current or the electrical potential in the electrolytic circuit).

In one embodiment of the present invention an electroless plating process uses a redox reaction to deposit metallic material (e.g., copper) on the wafer (e.g., in the interconnection trenches of a wafer) Electroless plating permits a constant copper ion concentration to bathe the interconnection trenches of a wafer depositing copper evenly in the trenches. In one embodiment of the present invention, electroless plating includes reduction of a complexed copper with formaldehyde in an alkaline solution (e.g., sodium hydroxide, copper sulfate, etc.). In a complex reaction catalyzed by palladium, the alkaline solution is broken down and the formaldehyde is oxidized, reducing the copper ion to metallic copper that is deposited in the interconnection trenches in the wafer. In one embodiment of the present invention, a copper seed layer is deposited on the wafer surface during an electroless plating process and that serves as the conducting film for electroplating of additional material (e.g., copper into interconnection trenches of a wafer).

In step 520 copper deposition is impeded on some portions of a wafer surface while the wafer is in the plating bath and a metallic material is deposited in desired locations of said wafer. In one embodiment of the present invention the wafer is placed into a plating bath (e.g., plating bath 235) and onto a polishing pad (e.g., polishing pad component 230). In one embodiment of deposition polishing method 500, the wafer is "polished" while a metallic material is deposited in desired locations of the wafer. In one example of the present invention copper deposition is impeded on some portions of a wafer surface and the wafer is polished by rubbing the surfaces of the polishing pad and wafer against one another. In one embodiment of the present invention, interconnection material (e.g., copper metal) is deposited in the interconnection trenches of the wafer. One embodiment of the present invention includes an electroplating process and another embodiment of the present invention includes an electroless plating process.

It should be appreciated that the frictional force utilized by deposition polishing method 500 is created in a variety of ways. In one embodiment of the present invention, the wafer holder rotates the wafer while asserting a downward pressure on the wafer forcing it onto the surface of the polishing pad. In another embodiment the polishing pad slides over the wafer while creating a force on the surface of the wafer. In one example of copper deposition polishing method 500 material is removed from portions of the surface of the wafer while material is being deposited in desired locations.

Plating solution is transported to desired locations of the wafer in step 530 of deposition polishing method 500. In one embodiment of the present invention, the plating solution is transported to desired locations by grooves and ducts in a polishing pad. For example, a solution dispensing polishing pad dispenses solution through solution dispensing ducts (e.g., solution dispensing duct 125). The solution dispensed in step 530 assists the fixed components achieve wafer planarization and material deposition in numerous ways. The liquid flow in the present invention is adjusted to minimize the scratching of the wafer surface by the fixed abrasive components.

In step 540, the wafer is removed from the polishing pad when the wafer has been polished. In one embodiment of deposition polishing method 500, a polishing machine subsequently dries the wafer and sends the wafer forward in the fabrication line for the next step in processing and prepares for a next wafer from a queue.

Thus, the present invention facilitates efficient material deposition and wafer polishing during IC wafer fabrication. The system and method of the present invention is particularly useful in facilitating efficient copper deposition and manufacturing of interconnections between components of an IC. A deposition polishing system and method of the present invention facilitates deposition of copper interconnection lines and plugs by performing copper deposition and polishing concurrently. The present invention deposition polishing system and method permits copper lines and plugs that are coupled to IC components to be manufactured in a wafer in a manner that maximizes the overall manufacturing wafer output capacity by reducing sequential delays (e.g., between copper deposition and CMP wafer planarization). The present invention impedes the deposition of copper on inappropriate portions of a wafer surface thereby reducing resources spent on relatively delicate operations (e.g., copper CMP processes) and reduces defect rates (e.g., corrosion due to wet processes or contamination from rapidly diffusing copper particles).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A deposition polishing system comprising:
   a polishing deposition machine adapted to provide an interface to control said deposition polishing system;
   a polishing pad component coupled to said polishing deposition machine, said polishing pad component adapted to polish and impede deposition on portions of a wafer surface;
   a plating bath coupled to said wafer holder, said plating bath is adapted to hold a plating solution; and
   a wafer holder coupled to said polishing deposition machine, said wafer holder adapted to hold said wafer inside of said plating bath, wherein said polishing pad component agitate said plating solution which enhances the redistribution of copper ions included in said plating solution and transports said plating solution to a volume inside an interconnection trench etched into said wafer.

2. The deposition polishing system of claim 1 in which said polishing deposition plating bath is a container for holding a plating solution.

3. The deposition polishing system of claim 1 in which said plating solution comprises copper ions that are attracted to and deposited on location of a surface of said wafer in accordance with a chemical reaction in which copper ions combine with electrons in the wafer to form copper metal on said location of said surface.

4. The deposition polishing system of claim 1 wherein said polishing pad component further comprises solution dispensing ducts in the surface of said polishing pad, said dispensing ducts adapted to aid distribution of said plating solution.

5. The deposition polishing system of claim 1 in which said polishing pad component is controlled to remove a copper seed layer and a barrier layer from a surface of said wafer area while leaving copper deposited in an interconnection trench.

6. The deposition polishing system of claim 1 further comprising:
   a support rail coupled to said plating bath, said support rail adapted to support said polishing pad component; and
   a filter coupled to said support rail, said filter adapted to aid the distribution of said plating solution.

7. A deposition polishing system of claim 6 in which metallic material is deposited in a location of a wafer by a plating process.

8. A deposition polishing system of claim 7 in which metallic material is deposited in an interconnection trench of said wafer by an electroplating process.

9. A deposition polishing system of claim 8 in which said differential electrical potential applied to a wafer is varied to assist material removal from the surface of the wafer around said location.

10. A deposition polishing system of claim 7 in which said plating bath is filled with an electrolyte solution comprising copper ions and said wafer serves as a cathode during an electroplating process in which a differential electrical potential is applied to said wafer and results in a negative electron concentration (e−) that attract and combine with the positive copper ions ($Cu^{2+}$) to form copper metal (Cu) in said location.

11. A deposition polishing system of claim 7 in which said deposition polishing system 200 utilizes said electroless plating process to deposit metallic material in a location trench of said wafer.

12. A deposition polishing system of claim 11 in which said electroless plating uses a redox reaction to deposit metal in said location of a wafer by permitting a constant copper ion concentration to bathe said interconnection trench and depositing copper evenly in said trenches.

13. A deposition polishing system of claim 11 in which the pressure and the motion of said abrasive polishing pad is controlled to removed a copper seed layer and a barrier layer from said wafer surface at the end point of a plating process while leaving cooper deposited in an interconnection trench.

14. A deposition polishing method comprising the steps of:
   depositing material on desired location of a wafer by a plating process;
   polishing said wafer and impeding copper deposition on some portions of a wafer surface while said wafer is in a plating bath and a metallic material is deposited in desired locations of said wafer;
   transporting plating solution to desired locations of said wafer, said plating solution dispenses from a solution dispensing polishing pad; and
   removing said wafer from a polishing pad when said wafer has been polished.

15. A deposition polishing method of claim 14 further comprising the step of agitating said plating solution to enhance the redistribution of ions in the plating solution to desired deposition areas of said wafer.

16. A deposition polishing method of claim 14 further comprising the step of utilizing an electroplating process to deposit material on a wafer.

17. A deposition polishing method of claim 16 further comprising the step of varying a differential electrical potential applied to said wafer.

18. A deposition polishing method of claim 16 further comprising the step of monitoring electroplating and polishing.

19. A deposition polishing method of claim 16 further comprising the step of utilizing the electrolytic circuit formed by the cathode, anode and ionized solution in a plating bath to facilitate supervision of copper deposition and planarization.

20. A deposition polishing method of claim 14 further comprising the step of utilizing an electroless plating process to deposit material on a wafer.

* * * * *